(12) United States Patent
McNeil et al.

(10) Patent No.: US 12,327,048 B2
(45) Date of Patent: *Jun. 10, 2025

(54) USING DUPLICATE DATA FOR IMPROVING ERROR CORRECTION CAPABILITY

(71) Applicant: Micron Technology, Inc., Boise, ID (US)

(72) Inventors: Jeffrey S. McNeil, Nampa, ID (US); Kishore Kumar Muchherla, Fremont, CA (US); Sivagnanam Parthasarathy, Carlsbad, CA (US); Patrick R. Khayat, San Diego, CA (US); Sundararajan Sankaranarayanan, Fremont, CA (US); Jeremy Binfet, Boise, ID (US); Akira Goda, Setagaya (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/401,251

(22) Filed: Dec. 29, 2023

(65) Prior Publication Data

US 2024/0134571 A1 Apr. 25, 2024

Related U.S. Application Data

(63) Continuation of application No. 17/691,467, filed on Mar. 10, 2022, now Pat. No. 11,861,233.

(Continued)

(51) Int. Cl.
*G06F 3/06* (2006.01)
*G11C 16/26* (2006.01)
*G11C 16/04* (2006.01)

(52) U.S. Cl.
CPC .......... *G06F 3/0659* (2013.01); *G06F 3/0619* (2013.01); *G06F 3/0673* (2013.01); *G11C 16/26* (2013.01); *G11C 16/0483* (2013.01)

(58) Field of Classification Search
CPC .... G06F 3/0659; G06F 3/0619; G06F 3/0673; G11C 16/26; G11C 16/0483; G11C 29/028; G11C 29/42; G11C 2029/0411

(Continued)

(56) References Cited

U.S. PATENT DOCUMENTS 9,563,504 B2 2/2017 Liang et al.
2006/0050314 A1 3/2006 Shiga et al.

(Continued)

*Primary Examiner* — Mardochee Chery
(74) *Attorney, Agent, or Firm* — Lowenstein Sandler LLP (57) ABSTRACT

A system can include a memory device and a processing device, operatively coupled with the memory device, to perform operations including reading a first copy of data stored in a first set of memory cells comprising a first memory cell, determining whether a threshold voltage of the first memory cell is within a first range of threshold voltages, responsive to determining that the threshold voltage of the first memory cell is within the first range of threshold voltages, reading a second copy of the data stored in a second set of memory cells comprising a second memory cell, determining whether a threshold voltage of the second memory cell is within a second range of threshold voltages, and responsive to determining that the threshold voltage of the second memory cell is outside the second range, using the second copy of the data.

20 Claims, 6 Drawing Sheets

Related U.S. Application Data

(60) Provisional application No. 63/292,830, filed on Dec. 22, 2021.

(58) Field of Classification Search
USPC .......................................................... 711/154
See application file for complete search history.

(56) References Cited

U.S. PATENT DOCUMENTS

2009/0043951 A1* 2/2009 Shalvi .................... G11C 11/56
711/E12.008
2019/0355397 A1 11/2019 Ishizu et al.

* cited by examiner

USING DUPLICATE DATA FOR IMPROVING ERROR CORRECTION CAPABILITY

RELATED APPLICATIONS

This application is a continuation application of co-pending U.S. patent application Ser. No. 17/691,467, filed Mar. 10, 2022, which claims the benefit of U.S. Provisional Patent Application No. 63/292,830, filed Dec. 22, 2021, each of which is incorporated herein by reference.

TECHNICAL FIELD

Embodiments of the disclosure relate generally to memory sub-systems, and more specifically, relate to using duplicate data to improve error correction capability in memory devices.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Aspects of the present disclosure are directed to using duplicate data to improve error correction capability in memory devices. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values. For example, a single level cell (SLC) can store one bit of information and has two logic states. The various logic states have corresponding threshold voltage ($V_t$) levels. A threshold voltage ($V_t$) is the voltage applied to the cell circuitry (e.g., control gate at which a transistor becomes conductive) to set the state of the cell. A cell is set to one of its logic states based on the $V_t$ that is applied to the cell. For example, if a high $V_t$ is applied to an SLC, a charge will be present in the cell, setting the SLC to store a binary logical state of 0. If a low $V_t$ is applied to the SLC, charge will be absent in the cell, setting the SLC to store a binary logical state of 1.

A memory device can be made up of cells arranged in a two-dimensional grid. Memory cells are etched onto a silicon wafer in an array of columns connected by conductive lines (also referred to as bitlines) and rows connected by conductive lines (also referred to as wordlines). A wordline can refer to a conductive line that connects control gates of a set (e.g., a row) of memory cells of a memory device that are used with one or more bitlines to generate the address of each of the memory cells. The intersection of a bitline and wordline constitutes the address of the memory cell. A block refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

A memory cell can be programmed (written to) by applying a certain voltage to the memory cell, which results in an electric charge being held by the memory cell, thus allowing modulation of the voltage distributions produced by the memory cell. Precisely controlling the amount of the electric charge stored by the memory cell allows establishing multiple logical levels. A read operation can be performed by comparing the measured threshold voltage ($V_t$) exhibited by the memory cell to one or more reference voltage levels in order to distinguish between two logical levels for single-level cells (SLCs) and between multiple logical levels for multi-level cells. Accordingly, certain non-volatile memory devices can use a demarcation voltage (read reference voltage) to read data stored at memory cells. For example, a demarcation voltage can be applied to the memory cells and if a threshold voltage of a particular memory cell is identified as being below the demarcation voltage that is applied to the particular memory cell, then the data stored at the particular memory cell can be read as a particular value (e.g., a logical '1') or determined to be in a particular state (e.g., a set state). If the threshold voltage of the particular memory cell is identified as being above the demarcation voltage, then the data stored at the particular memory cell can be read as another value (e.g., a logical '0') or determined to be in another state (e.g., a reset state). Thus, the demarcation voltage can be applied to memory cells to determine values stored at the memory cells. Such threshold voltage can be within a range of threshold voltages or a normal distribution of threshold voltages.

A memory device can experience varied workloads which can impact the threshold voltage distributions and cause them to shift to higher or lower values. Therefore, the threshold voltage of a memory cell or the threshold voltage distribution of all the memory cells in a memory sub-system can shift or change over time. In order to distinguish between adjacent distributions (corresponding to two different logical levels), the read threshold voltage levels can be defined such that any measured voltage that falls below a read threshold level is associated with one distribution of the pair of adjacent program distributions (e.g., a distribution corresponding to the logical state of '1'), while any measured voltage that is greater than or equal to the read threshold level is associated with another distribution of the pair of neighboring distributions (e.g., a distribution corresponding to the logical state of '0'). However, shifts of the distributions can cause them to overlap and make distinguishing the distribution to which a threshold voltage within the overlapping range of voltages belongs challenging. For example, a threshold voltage distribution of memory cells storing a logical state of '1' or a threshold voltage distribution of memory cells storing a logical state of '0' can drift over time and, consequently, shift the respective threshold voltage distribution to overlap with the other one. When the threshold voltage of a memory cell changes, the application of the demarcation voltage can yield an incorrect result and cause errors in the overlap region. Thus, when the threshold voltage distribution of memory cells storing logical states of '1' the threshold voltage distribution of memory cells storing logical states of '0' on a memory device shift in a manner such that a portions of one of the distributions overlaps with a portion of the other distribution, bit errors can occur when attempts to read the data on the cell are made by applying a read reference voltage within the range of voltages where the distributions overlap.

The shift in voltage distributions can affect other endurance-related characteristics of a memory component. When data is written to and/or erased from a memory cell of a memory device, the memory cell can be damaged. As the number of write operations and/or erase operations performed on a memory cell increases and the memory cell is increasingly damaged, the probability of the data stored at the memory cell including an error increases. A characteristic associated with the endurance of the memory component is the number of write operations or a number of program/erase (P/E) cycles performed on a memory cell of the memory component. An increasing number of read and write operations or P/E cycles can result in a higher error rate of the data stored at the memory cell. This can increase the use of an error detection and correction operation (e.g., an error control operation) for subsequent data operations (e.g., read and/or write) performed on the memory cell. The increased use of the error control operation can result in increased latency and a consequent reduction of the performance of the memory device. In addition, as the error rate for a memory cell or data block continues to increase, it may even surpass the error correction capabilities of the memory sub-system, leading to an irreparable loss of the data. Furthermore, as more resources of the memory sub-system are used to perform the error control operation, fewer resources are available to perform other read operations or write operations.

Therefore, upon a threshold number of read operations being performed on the data block, the memory sub-system can perform a data integrity check (also referred to herein as a "scan") to verify that the data stored at the data block does not include any errors. During the scan, one or more reliability statistics are determined for data stored at the data block. One example of a reliability statistic is a raw bit error rate (RBER). The RBER corresponds to a number of bit errors per unit of time that the data stored at the data block experiences and can be understood as the ratio of the number of erroneous bits to the number of all data bits stored in a certain portion of the memory device (e.g., in a specified data block). In some implementations, read operations can be performed in order to determine the RBER and the log likelihood ratio (LLR) of data being correctly read so that the errors could be remedied by error correction code (ECC). However, increased use of such scans and iterative determinations of RBER and LLR can also lead to increased latency, reduction of performance, as well as fewer resources being available to perform other operations in a memory sub-system. Moreover, additional P/E cycles caused by errors and by attempts to correct them often further decrease device endurance and reliability.

Aspects of the present disclosure address the above and other deficiencies by having a memory sub-system that uses duplicate data to reduce errors and extend the sub-system's endurance. Embodiments of the present disclosure can make use of some of the otherwise unused capacity or excess capacity (e.g., capacity allotted for overprovisioning) of a memory device to store duplicate copies of data. Accordingly, for at least some of the data stored on a memory device two or more copies of the data can be stored in different locations of the memory device.

In some embodiments, the two identical copies of the data can be stored in two locations, while in other embodiment an inverse copy of the data can be stored in one of the two locations. The memory cells in each of the respective locations on the memory device where the two copies of the data are stored can, consequently, have their own respective distributions of threshold voltages corresponding to the different programming states of the respective cells. As is described in more detail with reference to FIGS. 2A-2C and FIG. 3, due to the effects of continued use and degradation of the cells, the distributions of threshold voltages for each respective programming state of the cells can drift. Accordingly there can be a range of threshold voltages where the distributions of threshold voltages corresponding to one particular programming state overlap with the distributions of threshold voltages programming state overlap.

In some embodiments of the present disclosure, when the data needs to be read from the device, the data can initially be read from the first location. Then, a determination can be made whether the threshold voltage of the set of one or more memory cells at the first location is within the range of threshold voltages where the threshold voltage distributions for different programming states overlap. Throughout this description reference may be made to a set of one or more memory cells (each of which can correspond to a page, block, array or other subdivision of a memory device containing one or more memory cells). For example, in the context of a read operation a set of memory cells may refer to a page while in the context of a write operation, a set of memory cells may refer to a block. When reference is made to a set of memory cells, a description of characteristics or behavior of one memory cell of that set can be described and it can be assumed that other cells in the set can also have similar characteristics or behave in a similar manner. If the threshold voltage of the set of one or more memory cells in the first location is determined to be within the overlapping range of threshold voltage distributions, an attempt can be made to read the data from the other location. Then, a determination can be made whether the threshold voltage of the set of one or more memory cells at the other location is within the range of threshold voltages where the threshold voltage distributions for different programming states overlap. If the threshold voltage of the cell at the second location is outside the overlapping range, then the bit in the cell can be determined to be programmed to the programming state corresponding to the distribution within which the threshold voltage of the cell is found. In this case the data read from the second location can be used and significantly decrease the likelihood of reading the data incorrectly from the first location and either reduce the need to use the ECC or provide more reliable bits to the ECC.

However, if the threshold voltage of the cell at the second location is also determined to be within the overlapping range, another read operation can be performed at each location. This subsequent read operation can be a "strobed" read operation that applies multiple read strobes to read data at a location as described in more detail below with reference to FIG. 3. A "read strobe" herein refers to the application of a read voltage level to a wordline to determine whether a memory cell has a threshold voltages below or above the applied read voltage level. Thus, a read operation may include one or more read strobes. Accordingly, the second read operation can apply one strobe at a voltage that is positively offset from the initial read voltage level and another strobe that is negatively offset from the initial read voltage level. Using the strobed read, a measure of confidence or reliability (e.g., a LLR) that the data is correctly recorded at each respective location can be determined based on how far the threshold voltage is from the center of an overlapping range of threshold voltages. Accordingly, the data read from the location with the higher measure of confidence can be used and similarly either reduce the need to use the ECC or provide more reliable bits to the ECC.

As data is written to the memory device, the proportion of the data that is recorded in duplicate copies can be adjusted. The adjustment can correlate with keeping RBER below a desired threshold level. The higher the proportion of the data recorded in duplicate copies the lower the RBER can be due to the increased reliability of the data being recorded without errors.

Advantages of the present disclosure include, but are not limited to improving the reliability of data storage in the memory device. By storing duplicate copies of the data, the likelihood that the data stored in at least one of the locations can be read without producing errors is increased. This reduces the potential number of P/E cycles and error correction that needs to be performed. Furthermore, this can decrease the latency of read operations on the memory device and increase its endurance. The embodiments of the present disclosure permit a longer usable lifetime within which a memory device can operate within a given reliability margin and allow flexible control of the proportion of memory cells that operate with a desired level of reliability.

Figure 1:
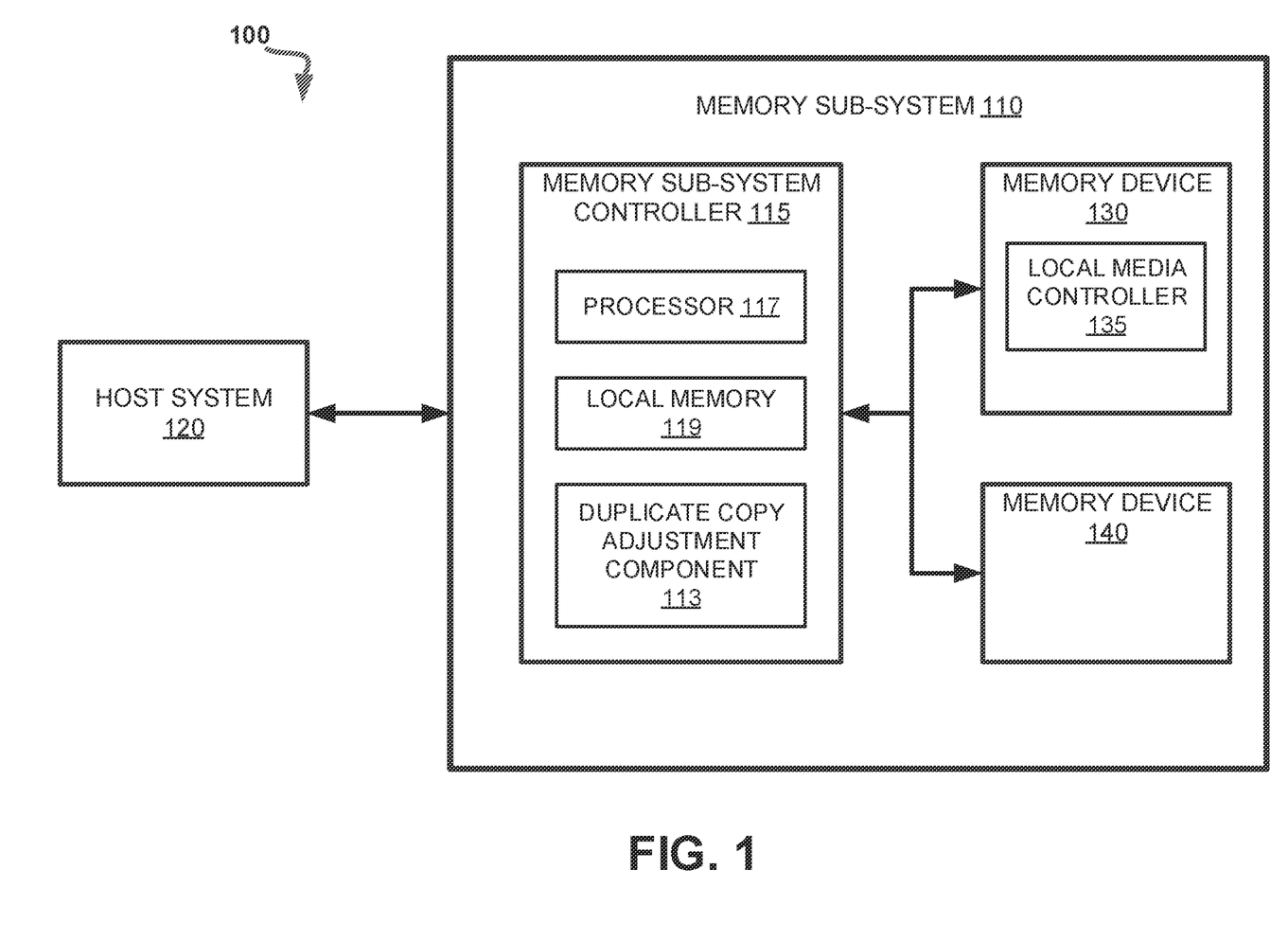
FIG. 1 illustrates an example computing system that includes a memory sub-system in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a duplicate copy adjustment (DCADCA) component 113 that can adjust the number of copies of data made to store the data on the memory device 130 and thereby adjust the effective number of bits that are stored per cell in the memory device 130. For example, if storing one bit of data in one cell at one location results in an effective one bit per cell being stored then having two copies of the data stored in two cells in different location results in an effective 0.5 bits per cell being stored. In some embodiments, the memory sub-system controller 115 includes at least a portion of the DCA component 113. In some embodiments, the DCA component 113 is part of the host system 120, memory sub-system 110, an application, or an operating system. In other embodiments, local media controller 135 includes at least a portion of DCA component 113 and is configured to perform the functionality described herein.

The DCA component 113 can receive data from the host system 120 or other components of the memory sub-system 110 to be stored on the memory device 130. In some embodiments, the DCA component 113 can be directly connected to memory device 130 or can be connected to the memory device 130 through memory sub-system controller 115. The DCA component 113 can write data on the memory device 130 and read data from the memory device 130. In an embodiment, for an amount of data intended to be saved on the memory device 130 the data can be divided into portions that can each be saved in the respective sets of memory cells of the memory device 130. The DCA component 113 can store multiple copies of a data portion in different sets of memory cells in the memory device 130. For example, the DCA component 113 can store one copy of the data portion in one set of memory cells of the memory device and store another copy of the data portion in a second set of memory cells of the memory device.

Figure 2A:
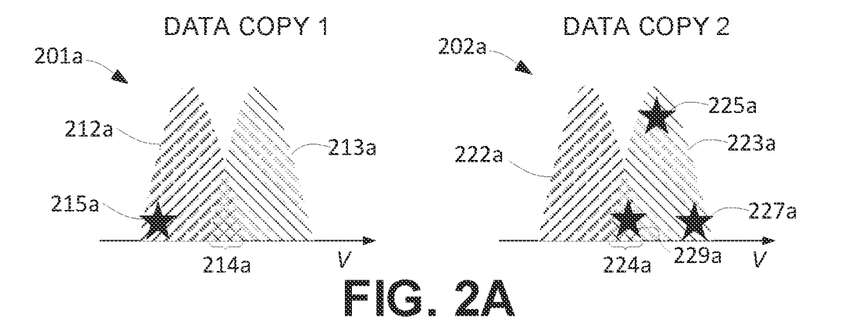
FIG. 2A depicts two graphs of threshold voltages within threshold voltage distributions in accordance with some embodiments of the present disclosure.
Figure 2B:
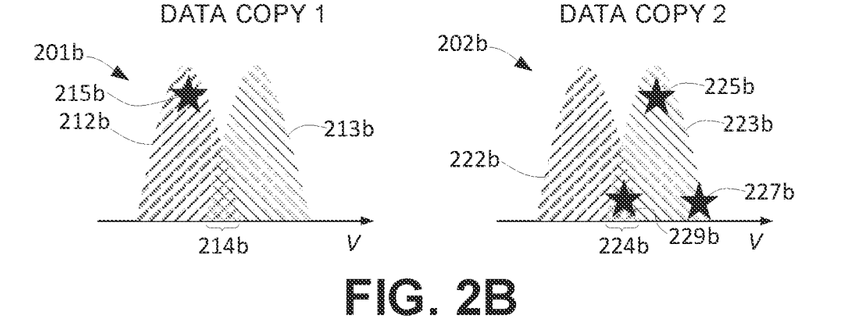
FIG. 2B depicts two graphs of threshold voltages within threshold voltage distributions in accordance with some embodiments of the present disclosure.
Figure 2C:
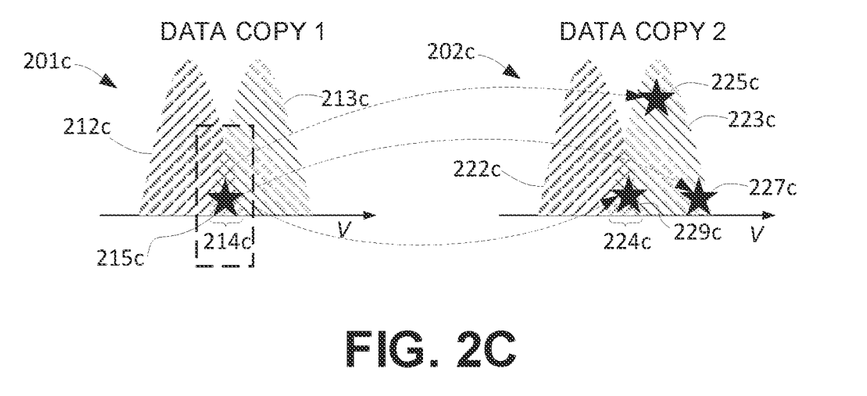
FIG. 2C depicts two graphs of threshold voltages within threshold voltage distributions in accordance with some embodiments of the present disclosure.

The memory cells where the copies of the data are stored can respectively be in different locations on the memory device 130. For example, among other possibilities, the respective copies of the data can be stored (a) in separate pages, (b) in different locations within the same page, (c) in adjacent sub-blocks, (d) in memory cells connected to adjacent word lines, or (e) in separate planes. It should be understood that more than two copies of the data can be made and saved in more than two different locations on the memory device 130. Furthermore, in some embodiments, such as the one depicted in FIGS. 2A-2C, one of the copies of the data portion can be an inverse of the first copy of the data portion (i.e., the memory cell storing a copy of a data bit being programmed to a logical state of '1' in one location and the memory cell storing a copy of the data bit programmed to a logical state of '0' in the other location). Each of FIG. 2A, FIG. 2B, and FIG. 2C depicts two graphs of threshold voltages of respective memory cells in two different locations on a memory device 130 shown within threshold voltage distributions of different programming states. Each of FIG. 2A, FIG. 2B, and FIG. 2C show two copies of data recorded where one of the copies of the data is the inverse of the other copy of the data.

In FIG. 2A, the copy of the data bit at the first location 201a is programmed in a memory cell with a threshold voltage represented by position 215a. Position 215a represents a threshold voltage that is unambiguously within the distribution 212a of threshold voltages of memory cells at location 201a programmed to a logical state of '1'. Position 215a is outside of the range of voltages within distribution 213a of threshold voltages of memory cells at location 201a programmed to a logical state of '0' and outside the range of voltages 214a where distribution 212a and distribution 213a overlap. The copy of the data bit at the second location 202a can be programmed in another memory cell with a threshold voltage represented by position 225a, position 227a, or position 229a. The potential threshold voltages represented by position 225a and position 227a are unambiguously within the range of voltages within distribution 223a of threshold voltages of memory cells at location 202a programmed to a logical state of '0'. The potential threshold voltage represented by position 229a, however, is within a range of voltage levels 224a where distribution 222a of threshold voltages of memory cells at location 202a programmed to a logical state of '1' overlaps with distribution 223a. Position 229a is not exclusively within only one of distribution 222a or distribution 223a.

In FIG. 2B, the copy of the data bit at the first location 201b is programmed in a memory cell with a threshold voltage represented by position 215b. Position 215b represents a threshold voltage that is unambiguously within the distribution 212b of threshold voltages of memory cells at location 201b programmed to a logical state of '1'. Position 215b is outside of the range of voltages within distribution 213b of threshold voltages of memory cells at location 201b programmed to a logical state of '0' and outside the range of voltages 214b where distribution 212b and distribution 213b overlap. The copy of the data bit at the second location 202b can be programmed in another memory cell with a threshold voltage represented by position 225b, position 227b, or position 229b. The potential threshold voltages represented by position 225b and position 227b are unambiguously within the range of voltages within distribution 223b of threshold voltages of memory cells at location 202b programmed to a logical state of '0'. The potential threshold voltage represented by position 229b, however, is within a range of voltage levels 224b where distribution 222b of threshold voltages of memory cells at location 202b programmed to a logical state of '1' overlaps with distribution 223b. Position 229b is not exclusively within only one of distribution 222b or distribution 223b.

In FIG. 2C, the copy of the data bit at the first location 201c is programmed in a memory cell with a threshold voltage represented by position 215c. Position 215c represents a threshold voltage that is not unambiguously within the distribution 212c of threshold voltages of memory cells at location 201c programmed to a logical state of '1' because it is also within the distribution 213c of threshold voltages of memory cells at location 201c programmed to a logical state of '0'. Thus position 215c is within the range of voltages 214c where distribution 212c and distribution 213c overlap. The copy of the data bit at the second location 202c can be programmed in another memory cell with a threshold voltage represented by position 225c, position 227c, or position 229c. The potential threshold voltages represented by position 225c and position 227c are unambiguously within the range of voltages within distribution 223c of threshold voltages of memory cells at location 202c programmed to a logical state of '0'. The potential threshold voltage represented by position 229c, however, is within a range of voltage levels 224c where distribution 222c of threshold voltages of memory cells at location 202c programmed to a logical state of '1' overlaps with distribution 223c. Position 229c is not exclusively within only one of distribution 222c or distribution 223c.

Thus, the DCA component 113 can receive instructions from the host system 120 or other components of the memory sub-system 110 to retrieve (i.e., read) data from the memory device 130. Accordingly, the DCA component 113 can read a copy of the data from one location on the memory device 130. The DCA component 113 can read the data by applying a read reference voltage level to the set of one or more memory cells storing the data on the memory device 130 and determining whether the threshold voltages of the set of one or more memory cells was higher or lower than the applied read reference voltage.

Considering that the threshold voltage distributions of the cells on the memory device for each of the respective programming states can overlap, there may be ranges of threshold voltages within which the threshold voltage of a memory cell can be said to represent a programming state of a bit with a high confidence and data and ranges of threshold voltages within which the threshold voltage of a memory cell can be said to represent a programming state of a bit with a low confidence. For example, if a threshold voltage of a memory cell is within the range of threshold voltages where the voltage distribution of cells programmed to a logical state of '1' overlaps with the voltage distribution of cells programmed to a logical state of '1', then the determination of the programming state of that cell by the read operation (i.e., through the application of the read reference voltage level to the cell) can be deemed to be a low confidence determination.

Accordingly, the DCA component 113 can determine whether a threshold voltage of the memory cell is within an overlapping range of one threshold voltage distribution and another threshold voltage distribution where each distribution represents a respective binary logical state of the memory cell. For example, the threshold voltage of the memory cell at location 201c can be determined to be at position 215c which is within the overlapping range 214c of distribution 212c and distribution 213c. Naturally, if the threshold voltage of the cell is determined to not be within the overlapping range it is determined to be outside the overlapping range and within a range of threshold voltages which is deemed to represent a programming state of the bit with high confidence. For example, the threshold voltage of the memory cell at location 201a can be determined to be at position 215a that is exclusively within distribution 212a and can therefore be deemed to represent a programming state of '1' with high confidence. Similarly, the threshold voltage of the memory cell at location 201b can be determined to be at position 215b that is exclusively within distribution 212b and can therefore be deemed to represent a programming state of '1' with high confidence. If the DCA component determines that the threshold voltage is not within the overlapping range, the DCA component 113 can use this copy of the data bit (i.e., use the programming state of the memory cell of the first location as representative of the value of that bit) for error correction or further operation of the memory device 130. In this case reading or referring to data stored at another (i.e., second) location may not be necessary. For example, if the threshold voltage of the memory cell at location 201a can be determined to be at position 215a it may not be necessary to read the data stored at location 202a Similarly, if the threshold voltage of the memory cell at location 201b can be determined to be at position 215b it may not be necessary to read the data stored at location 202b.

However, If the DCA component 113 determines that the threshold voltage of the first memory cell is within the overlapping range, in response to that determination, the DCA component 113 can read the other copy of the data that was stored in another cell in the other location and similarly determine whether the threshold voltage of the other memory cell is within a range of voltages where two voltage distributions, each distribution representative of a different respective binary logical state, overlap. For example, the threshold voltage of the memory cell at location 201c can be determined to be at position 215c that is within the overlapping range 214c.

Notably, if a threshold voltage of a memory cell is within the overlapping range, then the confidence that the bit is being read correctly (i.e., the programming state of the bit being correctly determined by the read operation) is low, and if threshold voltage of a memory cell is outside the overlapping range, then the confidence that the bit is being read correctly is high since, by extension, the threshold voltage of the cell will be clearly within a range of threshold distributions that unambiguously corresponds to one of the possible programming states of the memory cell. Accordingly, if the DCA component 113 determines that the threshold voltage of the second memory cell is outside the second overlapping range, this indicates with high confidence that the bit in the second memory cell (i.e., the memory cell in the other location where the data bit was stored) was read correctly. For example, if the threshold voltage of the memory cell at location 202c is determined to be in either one of position 225c or 227c, it would indicate with high confidence that the data bit in the memory cell at location 202c is being read correctly. Consequently, the DCA component 113 can use the second copy of the data bit (i.e., use the programming state of the memory cell of the second location as representative of the value of that bit) for error correction or further operation of the memory device 130. For example, if the threshold voltage of the memory cell at location 202c is determined to be in either one of position 225c or 227c, then the data bit value stored at location 202c can be used instead of that stored at location 201c.

However, if DCA component 113 determines that the threshold voltage of the second memory cell being is within the second overlapping range, then the programming state of the memory cell in the second location is not unambiguous. For example, if the threshold voltage of the memory cell at location 202c is determined to be at position 229c, it is within the overlapping range 224c. If a threshold voltage of a memory cell is unambiguously (i.e., exclusively) within a voltage distribution representative of a particular programming state (i.e., a '0' or a '1'), then, as used herein, the data bit in that memory cell can be deemed to have been "read correctly". Accordingly, to further resolve the ambiguity of the programming state of the data bit, the DCA component 113 can then determine a measure of confidence that the data bit is correctly read from the first memory cell and determine a measure of confidence that the data bit is correctly read from the second memory cell.

In some embodiments, the difference between the threshold voltage of a memory cell and the center of the overlapping range of voltage distributions can serve as a measure of confidence that the bit is read correctly. For example, the larger the difference between the threshold voltage of the memory cell and the voltage at the center of the overlapping range the higher the confidence that the bit is being read correctly (i.e., that the programming state of the memory cell is being properly determined). In some embodiments, the DCA component 113 can determine the log likelihood ratio (LLR) that the bit is correctly read at the memory cell at each respective location and use the LLR as a proxy (i.e., indirect indication) of a value representing a difference between the threshold voltage of the memory cell and the voltage at the center of the overlapping range. In other embodiments, described in more detail below and shown in FIG. 3, the DCA component 113 can perform a strobed read operation on each of the memory cells to divide the overlapping range of threshold voltages into bins of voltages relative to the voltage at the center of the overlapping distribution. Consequently, the DCA component 113 can use the copy of the data bit stored in the memory cell having the higher measure of confidence (i.e., use the programming state of the memory cell with the higher measure of confidence as representative of the value of that bit) for error correction or further operation of the memory device 130.

The range of threshold voltages that is unambiguously (i.e., exclusively) within a voltage distribution representative of a particular programming state (i.e., a '0' or a '1'), then, as used herein, that range of voltages can be deemed to be a "high reliability" range of threshold voltages. Thus, in some embodiments, the DCA component 113 can read a first copy of data in a first memory cell of a memory device 130 and determine whether the threshold voltage of the first memory cell is within the high reliability range of threshold voltages. If the DCA component 113 determines that the threshold voltage of the first memory cell is not within the high reliability range, then, in response, the DCA component 113 can read the second copy of the data in the second memory cell of the memory device and determine whether the threshold voltage of the second memory cell is within the high reliability range of threshold voltages.

In some embodiments, if the DCA component 113 determines that that the threshold voltage of the second memory cell is within the high reliability range, then the DCA component 113 can use the second copy of the data (i.e., use the programming state of the memory cell of the second location as representative of the value of that bit) for error correction or further operation of the memory device 130. However, if the DCA component 113 determines that the threshold voltage of the second memory cell is not within the high reliability range, the DCA component 113 can perform a strobed read operation on each memory cell.

Figure 3:
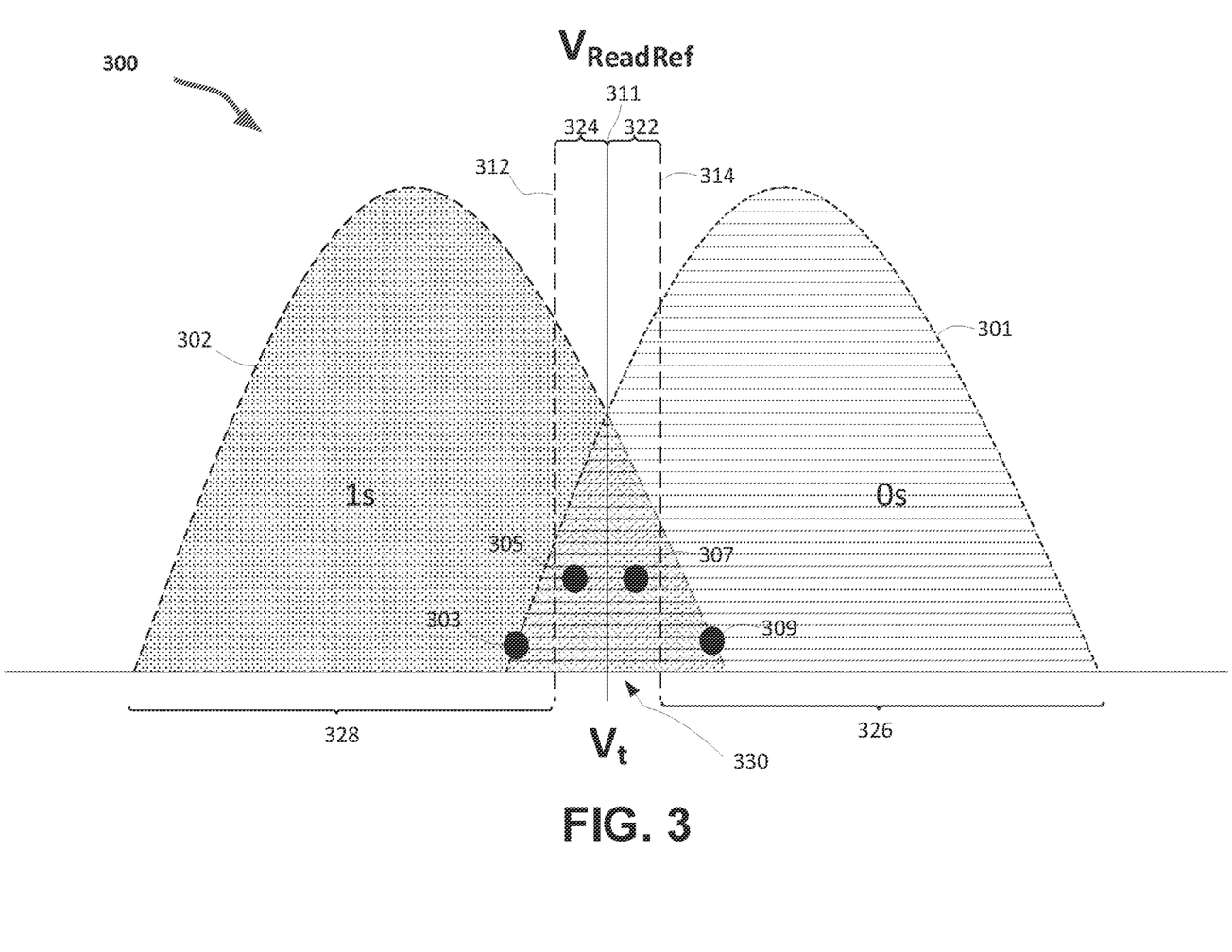
FIG. 3 depicts a diagram of a strobed read operation in accordance with some embodiments of the present disclosure.

FIG. 3 depicts a diagram 300 of a strobed read operation being performed on a memory cell whose threshold voltage can be within an overlapping range of threshold voltage distributions in accordance with some embodiments of the present disclosure. Threshold voltage distribution 302 represents the distributions of threshold voltages of memory cells programmed to a logical state of '1' while threshold voltage distribution 301 represents the distributions of threshold voltages of memory cells programmed to a logical state of '0'. The distributions overlap in the range of voltage levels 330.

The ability of the ECC to correct errors depends on strategies that make use of estimations of the exact values of the voltages at the potential positions of the threshold voltages in a given cell such as, for example, position 303, position 305, position 307, and position 309. Such estimations can be referred to herein as "soft information" and the aforementioned strobed read can be referred to herein as a "soft read". As noted earlier, when the voltage distributions overlap as shown with reference to the diagram 300 of FIG. 3, errors arise. In some embodiments the DCA component 113 can read all the values to the right of the reference voltage 311 as '0' and all the values to the left of the reference voltage 311 as '1'. Thus, in the depicted situation the overlap region 330 will be composed of read errors. However, it should be understood from the potential of the threshold voltages being at position 303, position 305, position 307, and position 309 that the error positions may vary in magnitude. The farther away (in terms of voltage) the error positions are from the reference voltage 311, the more probable it is that the memory cell contains the value that was stored. For example, position 307 is slightly to the right of the reference voltage 311 $V_R$ while position 309 is farther away from the reference voltage 311 $V_R$. As such, it is more likely that position 307 carries the greater error because correct values should not be close to the reference voltage. Alternatively, position 309 can be considered to carry less error than position 307 and is more likely to be read correctly. Similarly, position 305 is slightly to the left of the reference voltage 311 $V_R$ while position 303 is farther away to the right from the reference voltage 311 $V_R$. As such, it is more likely that position 305 carries the greater error because correct values should not be close to the reference voltage. In some embodiments, by exploiting the exact or estimated values of position 303 and position 305 or of position 307 and position 309, differentiation can be used between the two points and better information can then be provided to the ECC, resulting in improved decoding performance of the ECC in correcting the error.

In some embodiments, the soft information estimating the exact values of position 303 and position 305 or of position 307 and position 309, can be expressed by a log likelihood ratio (LLR). Thus, in some cases error position 307 could be presented to the ECC as a value of '0' and assigned a low magnitude LLR (i.e., probability) due to its close proximity to the reference voltage 311, whereas error position 309 could be presented to the ECC as a value of '0' and assigned a moderate magnitude LLR (probability) due to its greater distance from the reference voltage 311. In some embodiments the ECC can address and correct errors using the soft information provided by the LLRs. The LLR attributed to a bit can be representative of the probability that the voltage value read corresponds to a '0' or a '1' (i.e., probability that the bit in the memory cell was read correctly). In memory devices with few defects, a corresponding low raw bit error rate (RBER) will exist and most LLRs will have a large magnitude, while only a few LLRS will have a small magnitude.

To perform the strobed read operation on each of the first memory cell and second memory cell, the DCA component 113 can apply two or more additional read reference voltages 312, 314 to the respective cell. Each additional read reference voltage can be incrementally offset from the voltage level applied during the first read operation (i.e., the initial read reference voltage level 311). For example, if an initial read operation applied a read reference voltage 311 $V_R$ then two additional read reference strobes can be applied to the memory cell, one at a voltage level 314 of $V_R+i$ (i.e., positively offset by i volts from $V_R$) and another at a voltage level 312 of $V_R-i$ (i.e., negatively offset by i volts from $V_R$) where $V_R$ can correspond to the center of the overlapping range 330 of threshold voltages.

The reference voltage of each strobe of the strobed read operation can define a boundary of a bin of threshold voltages (i.e., a bin can have a maximum and minimum voltage defining the range of voltages within that bin). There may be multiple threshold voltage bins within the overlapping range of threshold distribution. For example one bin 322 can be defined to include the range of voltages from $V_R$ to $V_R+i$ and another bin 324 can be defined to include the range of voltages from $V_R$ to $V_R-i$. The same reference voltages of the strobes can also define other bins such as bin 326 that includes the range of voltages from $V_R+i$ to $\infty$ and bin 328 that includes the range of voltages from $V_R-i$ to 0.

In some embodiments, the DCA component 113 can perform additional strobed read operations by applying multiple read reference voltages that can define more bins on each side of the center of the overlapping range.

In some embodiments, the DCA component 113 can determine which of the first memory cell and the second memory cell has its threshold voltage within a bin farthest from a center of the respective overlapping range of voltage distribution. For example the threshold voltage in one memory cell at the first location can be determined to be at position 305 within bin 324 while the threshold voltage in the other memory cell at the second location can be determined to be at positon 309 within bin 326. Alternatively, the threshold voltage in one memory cell at the first location can be determined to be at position 303 within bin 328 while the threshold voltage in the other memory cell at the second location can be determined to be at positon 307 within bin 322. The distance (in terms of voltage difference) of the bin away from the center of the overlapping range can serve as a measure of confidence that the bit of the corresponding memory cell is being read correctly (i.e., that the programming state of the bit being correctly determined by the read operation). Accordingly, the farther (in terms of voltage difference) a bin is from the center of the overlapping range of voltage distribution, the higher the confidence the bit is read correctly. For example, if the threshold voltage of a memory cell is at positon 303 the there is a higher likelihood that it is being read correctly than if the threshold voltage of the memory cell was at position 309. Consequently, the DCA component 113 can use the copy of the data bit recorded in a memory cell having the threshold voltage within the bin farthest from a center of the overlapping range (i.e., use the programming state of the memory cell with the threshold voltage in the bin farthest from the center of the range as representative of the value of that bit) for error correction or further operation of the memory device 130.

Thus, in some embodiments, the DCA component 113 can send the data bit determined to be read with higher confidence to the ECC to increase the likelihood that the ECC will succeed in correcting the error and determine the correct programming state of the data bit. In other embodiments the DCA component 113 can provide a sum of the measures of confidence for each of the respective memory cell to the ECC to increase the likelihood that the ECC will succeed in correcting the error and determine the correct programming state of the data bit.

Furthermore, in some embodiments, the DCA component 113 can control the percentage or proportion of data portions that are recorded in multiple copies on the memory device 130 to increase the bits-per-cell (BPC) ratio. For example, instead of storing all of the data in 2 copies which would result in a BPC of 0.5, the DCA component 113 can store half the data in 2 copies with the remaining data only stored in 1 copy and result in a BPC of 0.75. Accordingly, the DCA component 113 can adjust the proportion of data portions that are recorded in multiple copies to achieve a desired BPC or maintain a desired level of RBER. Further details with regards to the operations of the DCA component 113 are described with reference to FIG. 4 and FIG. 5 below.

Figure 4:
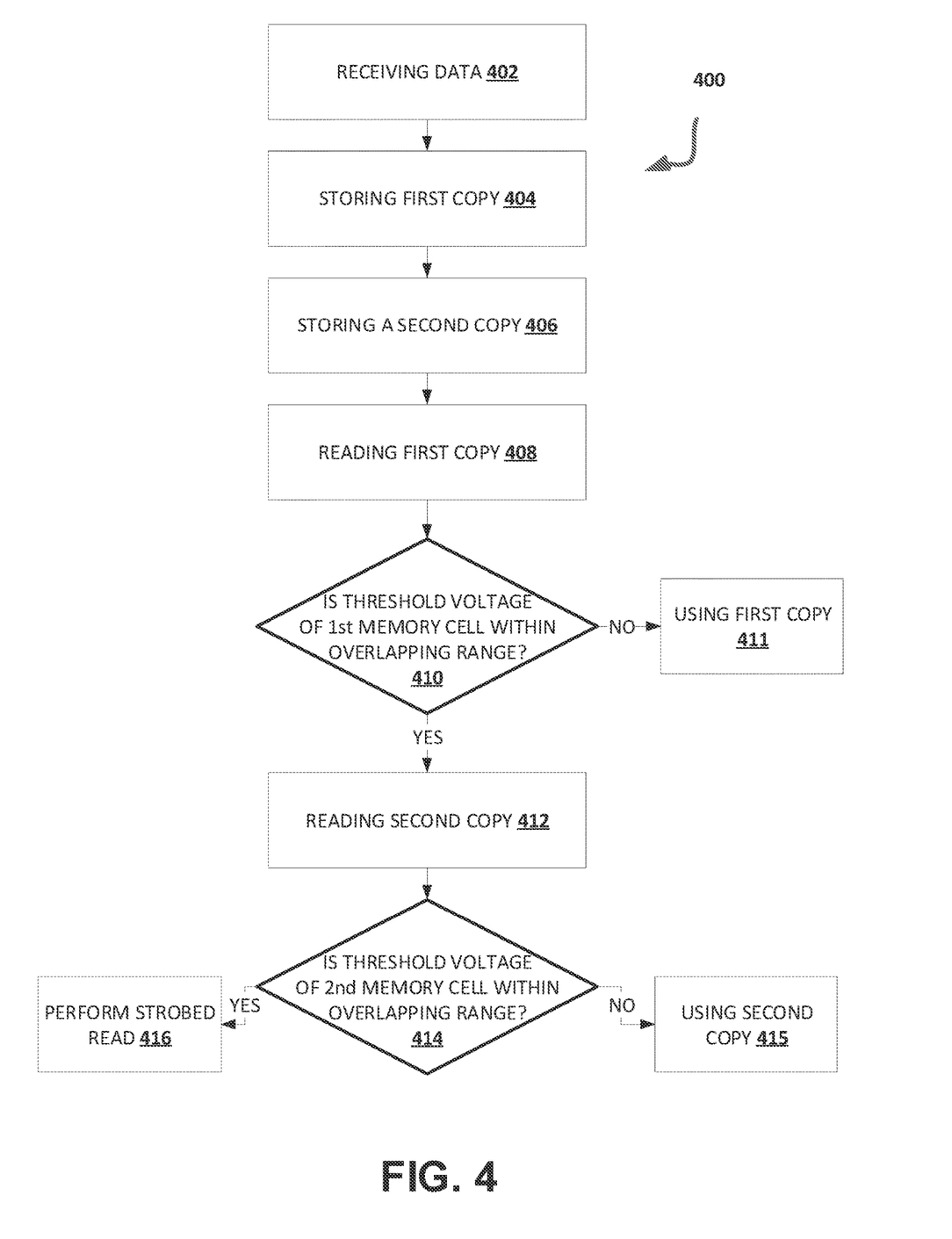
FIG. 4 is a flow diagram of an example method for using duplicate data to reduce a raw bit error rate in accordance with some embodiments of the present disclosure.

FIG. 4 is a flow diagram of an example method 400 for using duplicate data to reduce a raw bit error rate (RBER) in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the DCA component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 402, the processing logic can receive data from the host system 120 or other components of the memory sub-system 110 to be stored on the memory device 130. The processing logic can divide the received data into portions to be stored in the sets of one or more memory cells of the memory device 130.

Having received or otherwise obtained data to be stored the processing logic can, at operation 404, can store a first copy of the data in a memory cell at a first location on the memory device 130. At operation 406, the processing logic can store a second copy of the data in another memory cell at another location on the memory device 130. In some embodiments, the second copy of the data can be an inverse of the first copy of the data. The different copies of the data can be stored (a) on separate pages, (b) in different locations within the same page, (c) in adjacent sub-blocks, (d) in memory cells of adjacent word lines, or (e) in separate planes of the memory device 130.

The processing logic can receive instructions from the host system 120 or other components of the memory sub-system 110 to retrieve (i.e., read) data from the memory device 130. Accordingly, at operation 408, the processing logic can read the copy of the data from the memory cell at the first location on the memory device 130. Then, at operation 410, the processing logic can determine whether the threshold voltage of the memory cell is within an overlapping range of one threshold voltage distribution and another threshold voltage distribution where each distribution represents a different respective binary logical state of the memory cell. In some embodiments the processing logic can determine, at operation 410, whether the threshold voltage of the memory cell is within a high reliability range of threshold voltages.

In some embodiments, if it is determined, at operation 410, that the threshold voltage of the memory cell is not within an overlapping range, the processing logic can, at operation 411 use the copy of the data stored in the memory cell at the first location of memory device 130. If it is determined, at operation 410, that the threshold voltage of the memory cell is within an overlapping range (i.e., not within a high reliability range of threshold voltages), the processing logic can, at operation 412, the processing logic can read the other copy of the data stored in the other memory cell at the other location on the memory device 130.

At operation 414, the processing logic can determine whether the threshold voltage of the cell at the second location is within an overlapping range of voltage distributions that each respectively represent different programming states of the memory cell. In some embodiments the processing logic can determine, at operation 414, whether the threshold voltage of the memory cell at the second location is within a high reliability range of threshold voltages. If it is determined, at operation 414, that the threshold voltage of the memory cell at the second location is not within an overlapping range (i.e., is within a high reliability range of threshold voltages), the processing logic can, at operation 415, use the copy of the data stored in the memory cell at the second location of memory device 130.

However, if it is determined, at operation 414, that the threshold voltage of the memory cell at the second location is within the overlapping range of threshold voltage distributions, the processing logic can, at operation 416, perform a strobed read operation which is described in more detail with reference to FIG. 5.

Figure 5:
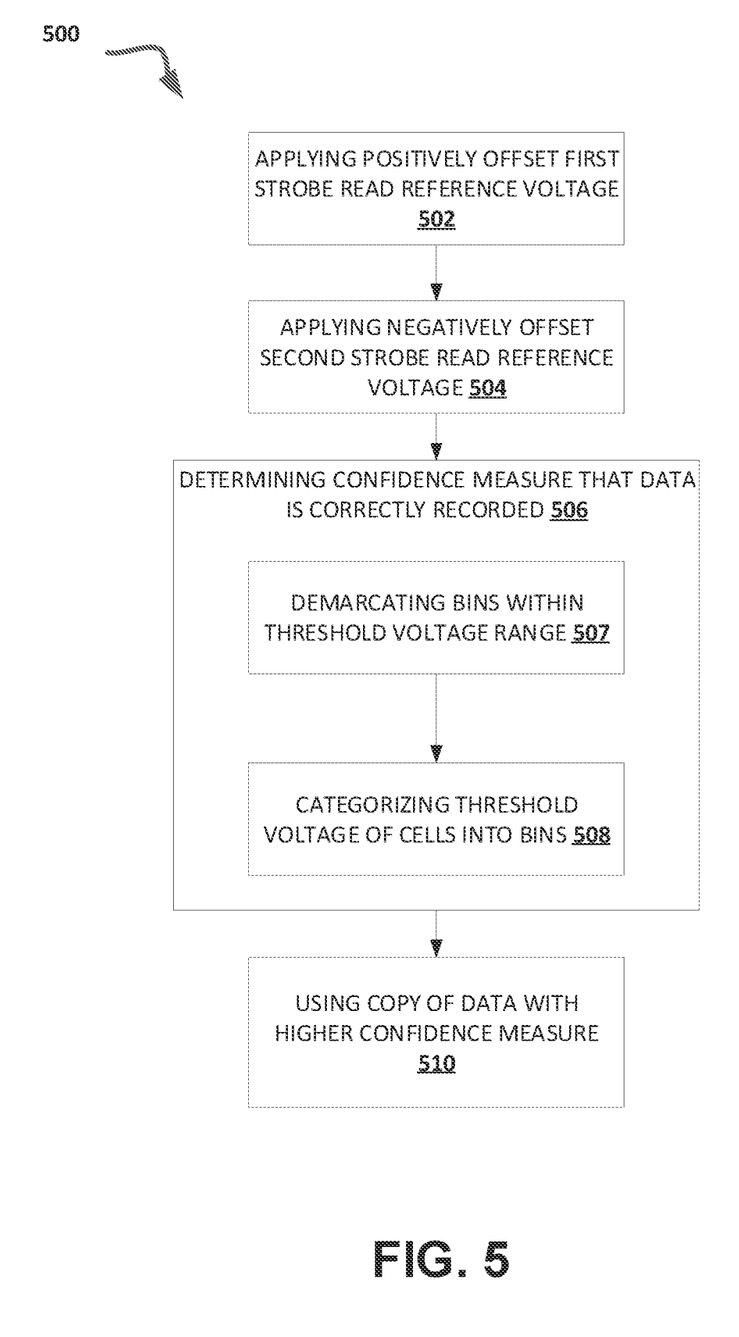
FIG. 5 is a flow diagram of an example method for using a strobed read operation to reduce a raw bit error rate in accordance with some embodiments of the present disclosure.

FIG. 5 is a flow diagram of an example method 500 for using a strobed read operation to reduce a raw bit error rate (RBER) in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the DCA component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In some embodiments, in response to determining, at operation 414, that the threshold voltage of the second memory cell is be within the overlapping range, the processing logic can, for the memory cells at each of the two locations, at operation 502, apply a strobe read voltage that is positively offset from the initial read reference voltage applied during the initial read operation. Then, at operation 504, the processing logic can, for the memory cells at each of the two locations, at operation 502, apply a strobe read voltage that is negatively offset from the initial read reference voltage applied during the initial read operation. For example, if the processing logic applied a read reference voltage of $V_R$ during the initial read operation, then two additional read reference strobes can be applied to the memory cell, one at a voltage level of $V_R+i$ (i.e., positively offset by i volts from $V_R$) and another at a voltage level of $V_R-i$ (i.e., negatively offset by i volts from $V_R$) where $V_R$ can correspond to the center of the overlapping range of threshold voltages.

At operation 506, the processing logic can determine a measure of confidence that the data bit is correctly read from the first memory cell and determine a measure of confidence that the data bit is correctly read from the second memory cell. Determining the confidence measure at operation 507 can include demarcating bins, at operation 507, within the overlapping range of threshold voltages and categorizing, at operation 508, the threshold voltages the cell into the bins. The reference voltage of each strobe of the strobed read operation can define a boundary of a bin of threshold voltages within the overlapping range of threshold distribution. For example one bin can be defined to include the range of voltages from $V_R$ to $V_R+i$ and another bin can be defined to include the range of voltages from $V_R$ to $V_R-i$. The same reference voltages of the strobes can also define other bins such as bin that includes the range of voltages from $V_R+i$ to ∞ and bin that includes the range of voltages from $V_R-i$ to 0. Accordingly, at operation 507, the processing logic can demarcate the bins with the boundaries of the bins being defined by the voltage levels applied for each of the additional read strobes. Then, at operation 508, the processing logic can determine the bin of thresholds voltages within which the threshold voltage of the cell is found and categorize the threshold voltage of the cell accordingly. In some embodiments, the processing logic can perform additional strobed read operations by applying multiple read reference voltages that can define more bins on each side of the center of the overlapping range.

Thus, the processing logic can determine a measure of confidence that the data bit in the cell is being read correctly. In some embodiments, the difference between the threshold voltage of a memory cell and the center of the overlapping range of voltage distributions can serve as a measure of confidence that the bit is read correctly. For example, the larger the difference between the threshold voltage of the memory cell and the voltage at the center of the overlapping range the higher the confidence that the bit is being read correctly (i.e., that the programming state of the memory cell is being properly determined). In some embodiments, the processing logic can determine the log likelihood ratio (LLR) that the data bit is correctly read at the memory cell at each respective location and use the LLR as a proxy (i.e., indirect indication) of a value representing a difference between the threshold voltage of the memory cell and the voltage at the center of the overlapping range. In other embodiments, the processing logic can determine the distance (in terms of voltage difference) of the bin away from the center of the overlapping range and use it as a measure of confidence that the bit of the corresponding memory cell is being read correctly. Then, at operation 510 processing logic can use the copy of the data bit stored in the memory cell having the higher measure of confidence.

Figure 6:
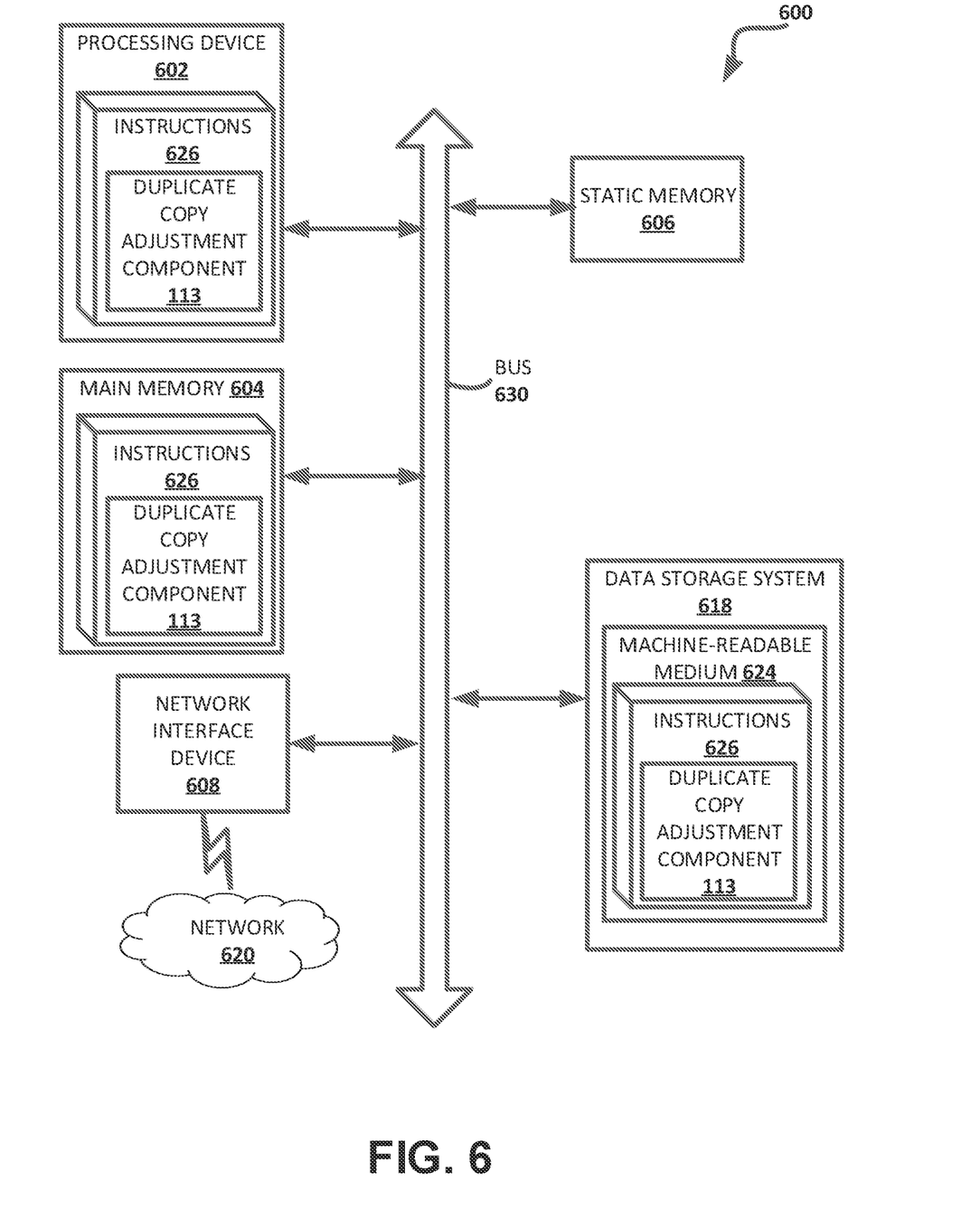
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the DCA component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein including method 400 and method 500. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a DCA component (e.g., the DCA component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to perform operations comprising:
reading a first copy of data stored in a first set of memory cells comprising a first memory cell;
determining whether a threshold voltage of the first memory cell is within a first range of threshold voltages;
responsive to determining that the threshold voltage of the first memory cell is within the first range of threshold voltages, reading a second copy of the data stored in a second set of memory cells comprising a second memory cell;

determining whether a threshold voltage of the second memory cell is within a second range of threshold voltages; and responsive to determining that the threshold voltage of the second memory cell is outside the second range, using the second copy of the data.

2. The system of claim 1, wherein the second copy of the data is an inverse of the first copy of the data.

3. The system of claim 1, wherein the processing device is to further perform the operations comprising:

responsive to determining that the threshold voltage of the second memory cell is within the second range, determining respective measures of confidence that the data is correctly read for each of the first memory cell and the second memory cell.

4. The system of claim 3, wherein the processing device is to further perform the operations comprising:

responsive to determining that the first copy of the data has a higher measure of confidence, using the first copy of the data.

5. The system of claim 3, wherein the measure of confidence that the data is correctly stored for a memory cell is based on a difference between the threshold voltage of the memory cell and a voltage at a center of a corresponding range of voltage distributions.

6. The system of claim 3, wherein the measure of confidence that the data is correctly stored for each memory cell is a log likelihood ratio.

7. The system of claim 1, wherein the first memory cell and the second memory cell are each in a different location on the memory device, the location being one of a block or a plane on a die of the memory device.

8. A method comprising:

reading a first copy of data stored in a first set of memory cells comprising a first memory cell;

determining whether a threshold voltage of the first memory cell is within a first range of threshold voltages;

responsive to determining that the threshold voltage of the first memory cell is within the first range of threshold voltages, reading a second copy of the data stored in a second set of memory cells comprising a second memory cell;

determining whether a threshold voltage of the second memory cell is within a second range of threshold voltages; and responsive to determining that the threshold voltage of the second memory cell is outside the second range, using the second copy of the data.

9. The method of claim 8, wherein the second copy of the data is an inverse of the first copy of the data.

10. The method of claim 8, further comprising:

responsive to determining that the threshold voltage of the second memory cell is within the second range, determining respective measures of confidence that the data is correctly read for each of the first memory cell and the second memory cell.

11. The method of claim 10, further comprising:

responsive to determining that the first copy of the data has a higher measure of confidence, using the first copy of the data.

12. The method of claim 10, wherein the measure of confidence that the data is correctly stored for a memory cell is based on a difference between the threshold voltage of the memory cell and a voltage at a center of a corresponding range of voltage distributions.

13. The method of claim 10, wherein the measure of confidence that the data is correctly stored for each memory cell is a log likelihood ratio.

14. The method of claim 8, wherein the first memory cell and the second memory cell are each in a different location on a memory device, the location being one of a block or a plane on a die of the memory device.

15. A non-transitory computer-readable storage medium comprising instructions that, when executed by a processing device, cause the processing device to perform operations comprising:

reading a first copy of data stored in a first set of memory cells comprising a first memory cell;

determining whether a threshold voltage of the first memory cell is within a first range of threshold voltages;

responsive to determining that the threshold voltage of the first memory cell is within the first range of threshold voltages, reading a second copy of the data stored in a second set of memory cells comprising a second memory cell;

determining whether a threshold voltage of the second memory cell is within a second range of threshold voltages; and responsive to determining that the threshold voltage of the second memory cell is outside the second range, using the second copy of the data.

16. The non-transitory computer-readable storage medium of claim 15, wherein the second copy of the data is an inverse of the first copy of the data.

17. The non-transitory computer-readable storage medium of claim 15, the operations further comprising:

responsive to determining that the threshold voltage of the second memory cell is within the second range, determining respective measures of confidence that the data is correctly read for each of the first memory cell and the second memory cell.

18. The non-transitory computer-readable storage medium of claim 17, the operations further comprising:

responsive to determining that the first copy of the data has a higher measure of confidence, using the first copy of the data.

19. The non-transitory computer-readable storage medium of claim 17, wherein the measure of confidence that the data is correctly stored for a memory cell is based on a difference between the threshold voltage of the memory cell and a voltage at a center of a corresponding range of voltage distributions.

20. The non-transitory computer-readable storage medium of claim 17, wherein the measure of confidence that the data is correctly stored for each memory cell is a log likelihood ratio.

* * * * *